United States Patent
Omura

(10) Patent No.: US 9,755,121 B2
(45) Date of Patent: Sep. 5, 2017

(54) METHOD OF DETACHING SEALING MEMBER OF LIGHT EMITTING DEVICE

(71) Applicant: NICHIA CORPORATION, Anan-shi, Tokushima (JP)

(72) Inventor: Shingo Omura, Sagamihara (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 15/270,874

(22) Filed: Sep. 20, 2016

(65) Prior Publication Data

US 2017/0012184 A1    Jan. 12, 2017

Related U.S. Application Data

(62) Division of application No. 14/211,400, filed on Mar. 14, 2014, now Pat. No. 9,472,715.

(30) Foreign Application Priority Data

Mar. 15, 2013  (JP) .................. 2013-053451

(51) Int. Cl.
*H01L 21/00* (2006.01)
*H01L 33/54* (2010.01)
(Continued)

(52) U.S. Cl.
CPC .......... *H01L 33/54* (2013.01); *H01L 33/0095* (2013.01); *H01L 33/507* (2013.01); *H01L 33/56* (2013.01); *H01L 33/62* (2013.01); *H01L 33/52* (2013.01); *H01L 2224/13* (2013.01); *H01L 2933/005* (2013.01); *H01L 2933/0041* (2013.01); *H01L 2933/0066* (2013.01)

(58) Field of Classification Search
CPC ......... H01L 33/52; H01L 33/54; H01L 33/56; H01L 2933/005; H01L 21/563; H01L 21/565; H01L 21/566; H01L 21/568
See application file for complete search history.

(56) References Cited

U.S. PATENT DOCUMENTS 5,371,328 A    12/1994  Gutierrez et al.
5,953,210 A    9/1999   Lo
(Continued)

FOREIGN PATENT DOCUMENTS

JP    H07-66242 A       3/1995
JP    2004-349274 A     12/2004
(Continued)

OTHER PUBLICATIONS

IBM Technical Disclosure Bulletin, vol. No. 34, pp. 181-182 (Jul. 1991).
(Continued)

*Primary Examiner* — Reema Patel
*Assistant Examiner* — Syed Gheyas
(74) *Attorney, Agent, or Firm* — Foley & Lardner LLP

(57) ABSTRACT

A method of detaching a sealing member of a light emitting device which has a substrate, alight emitting element mounted on the substrate and a sealing member that seals the light emitting element, wherein a release layer and/or an air layer is/are provided between the substrate and the sealing member; and the sealing member is detached from the substrate at the release layer and/or the air layer.

10 Claims, 4 Drawing Sheets

(51) Int. Cl.
*H01L 33/00* (2010.01)
*H01L 33/50* (2010.01)
*H01L 33/56* (2010.01)
*H01L 33/62* (2010.01)
*H01L 33/52* (2010.01)

(56) References Cited

U.S. PATENT DOCUMENTS

| | | | |
|---|---|---|---|
| 6,291,274 B1* | 9/2001 | Oida | H01L 21/565 |
| | | | 257/E21.504 |
| 6,396,712 B1 | 5/2002 | Kuijk | |
| 8,222,059 B2 | 7/2012 | Ashida | |
| 8,759,123 B2 | 6/2014 | Wada et al. | |
| 2007/0126356 A1 | 6/2007 | Tanda et al. | |
| 2008/0265355 A1* | 10/2008 | Yoshizawa | H01L 21/566 |
| | | | 257/433 |
| 2009/0072265 A1 | 3/2009 | Nakamura et al. | |
| 2009/0267102 A1* | 10/2009 | Tsai | H01L 33/56 |
| | | | 257/98 |
| 2009/0283900 A1* | 11/2009 | Yamada | H01L 21/565 |
| | | | 257/698 |
| 2012/0235190 A1 | 9/2012 | Keller et al. | |
| 2012/0241789 A1* | 9/2012 | Chan | H01L 33/486 |
| | | | 257/98 |

FOREIGN PATENT DOCUMENTS

| | | |
|---|---|---|
| JP | 2008-041968 A | 2/2008 |
| JP | 2009-177117 A | 8/2009 |
| JP | 2011-204397 A | 10/2011 |
| WO | WO 2007/135754 A1 | 11/2007 |

OTHER PUBLICATIONS

Non-Final Rejection issued in U.S. Appl. No. 14/211,400, mailed Jul. 14, 2015.
Final Rejection issued in U.S. Appl. No. 14/211,400, mailed Jan. 7, 2016.
Notice of Allowance issued in U.S. Appl. No. 14/211,400, mailed Jul. 15, 2016.

* cited by examiner

METHOD OF DETACHING SEALING MEMBER OF LIGHT EMITTING DEVICE

CROSS-REFERENCE TO RELATED APPLICATIONS

The present application is a divisional of U.S. patent application Ser. No. 14/211,400, filed on Mar. 14, 2014, which claims priority to Japanese Patent Application No. 2013-053451, filed on Mar. 15, 2013, the entireties of which are all hereby incorporated herein by reference.

BACKGROUND

1. Field of the Invention

The present disclosure relates to a method of detaching a sealing member of a light emitting device.

2. Description of the Related Art

Conventionally, for the purpose of improving manufacturing yield of a light emitting device, a light emitting element that is found to be defective after being mounted on a substrate is detached and then replaced with a non-defective light emitting element (for example, see Japanese Patent Application Laid-open No. 2004-349274).

SUMMARY

A method of detaching a sealing member of a light emitting device according to one embodiment is a method of detaching a sealing member of a light emitting device which has a substrate, a light emitting element mounted on the substrate and a sealing member that seals the light emitting element, wherein a release layer is provided between the substrate and the sealing member; and the sealing member is detached from the substrate at the release layer.

Another method of detaching a sealing member of a light emitting device according to an embodiment is a method of detaching a sealing member of a light emitting device which has a substrate, a light emitting element mounted on the substrate and a sealing member that seals the light emitting element, wherein an air layer is provided between the substrate and the sealing member; and the sealing member is detached from the substrate at the air layer.

DETAILED DESCRIPTION OF THE EMBODIMENTS

Figure 1A:
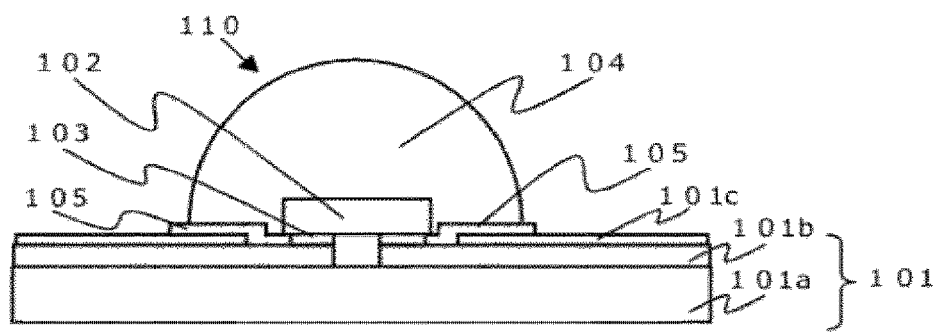
FIG. 1(a) is a schematic sectional view of a light emitting device and FIG. 1(b) is a schematic sectional view illustrating a method of detaching a sealing member according to one embodiment.
Figure 1B:
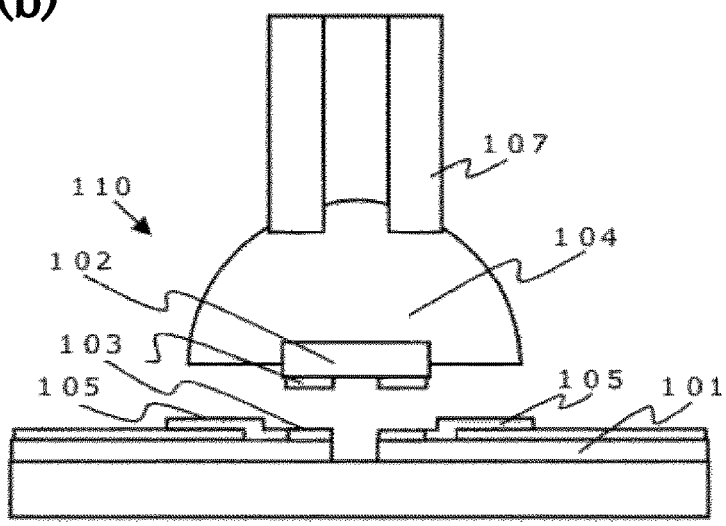

Next, embodiments will be described with reference to the drawings (FIGS. 1 to 4).

An light emitting device according to an embodiment includes a substrate, a light emitting element mounted on the substrate, a sealing member that seals the light emitting element, and a release layer provided between the substrate and the sealing member. The sealing member is detached from the substrate at the release layer.

Another light emitting device according to the present invention includes a substrate, a light emitting element mounted on the substrate, a sealing member that seals the light emitting element, and an air layer provided between the substrate and the sealing member. In addition, the sealing member is detached from the substrate at the air layer.

(Substrates 101, 201, 304, and 401)

The substrate is a member on which the light emitting element is mounted.

The substrate refers to a so-called mounting substrate, package base, or the like. Materials of the substrate are not particularly limited and examples thereof include resins such as thermosetting resins and thermoplastic resins (rigid materials including phenolic resin and glass epoxy resin, flexible materials including BT resin, PPA, polyimide, PET, PEN, PVDF, and liquid crystal polymer, and the like), insulating materials such as ceramics and glass, metals such as copper, aluminum, nickel, iron, and tungsten and alloys thereof, and metals and alloys whose surfaces are subjected to various types of plating or provided with insulating layers.

The shape of the substrate is not particular limited and preferable examples include a plate shape, a sheet shape, and a shape having a depressed portion that houses the light emitting element.

The surface of the substrate favorably has a high optical reflectance. Specifically, white insulating material such as epoxy resin, silicone resin and PPA containing alumina, titanium oxide, or silicon oxide, polyimide film coated by a white resist made of silicone resin containing titanium oxide, and the like can be used.

On a face of the substrate on which the light emitting element is to be mounted, at least two pieces of wiring that are separated from one another exist so as to correspond to a pair of electrodes of at least one light emitting element. In addition, as long as wiring exists on a surface of the face of the substrate on which the light emitting element is mounted, wiring may additionally exist on a surface of a face opposite to the face on which the light emitting element is to be mounted or wiring may be embedded in one layer or many layers inside the substrate. A shape of such a wiring pattern is not particularly limited and various shapes can be adopted.

Materials of the wiring are not particularly limited as long as the material is conductive and examples thereof include metals such as gold, silver, copper, nickel, and aluminum or alloys thereof. The wiring may be formed by plating using these materials or formed using a conductive paste, a conductive ink, or the like. In addition, the wiring may be formed by laminating these materials. Furthermore, a material with a high optical reflectance is favorably used for an outermost surface on which the light emitting element is to be mounted. Silver is particularly preferable.

When the substrate is conductive, the substrate may be used as the wiring.

(Light Emitting Elements 102, 202, 302, and 402)

A semiconductor light emitting element (for example, an LED) can be used as the light emitting element. A semiconductor light emitting element is constituted by a laminated structure in which a semiconductor layer of a nitride semiconductor such as InN, AlN, GaN, InGaN, AlGaN, and InGaAlN, a III-V group compound semiconductor, or a II-VI group compound semiconductor is laminated on a substrate. Examples of the substrate of the light emitting element include an insulating substrate made of sapphire or the like and a conductive substrate made of SiC, GaN, GaAs, or the like.

With a semiconductor light emitting element using an insulating substrate, an n-side electrode and a p-side electrode may be formed on an upper face of the laminated structure. With a semiconductor light emitting element using a conductive substrate, one of the electrodes (for example, the n-side electrode) may be formed on an upper face of the laminated structure and the other electrode (for example, the p-side electrode) is formed on a lower face of the laminated structure.

Figure 2A:
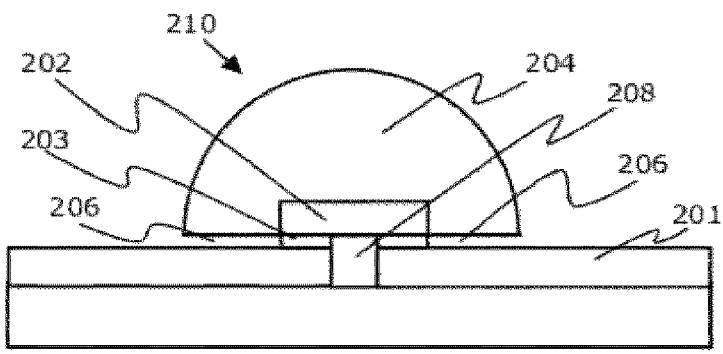
FIG. 2(a) is a schematic sectional view of another light emitting device and FIG. 2(b) is a schematic sectional view illustrating a method of detaching a sealing member according to another embodiment.
Figure 2B:
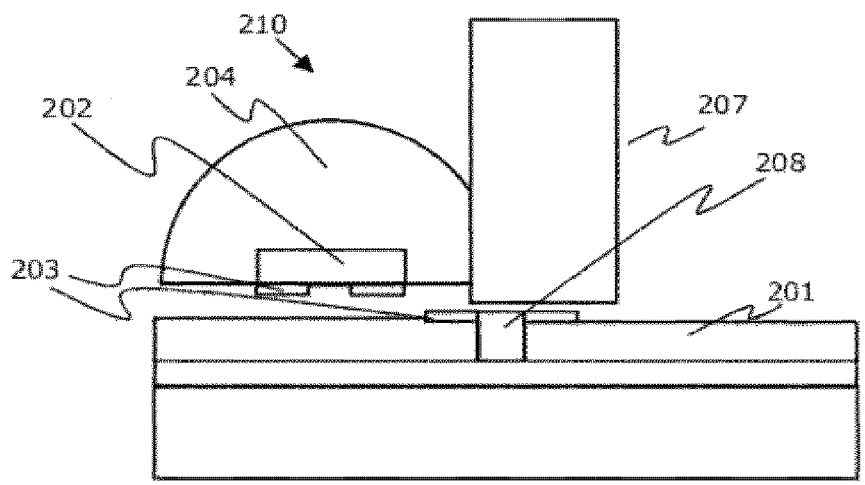
Figure 3:
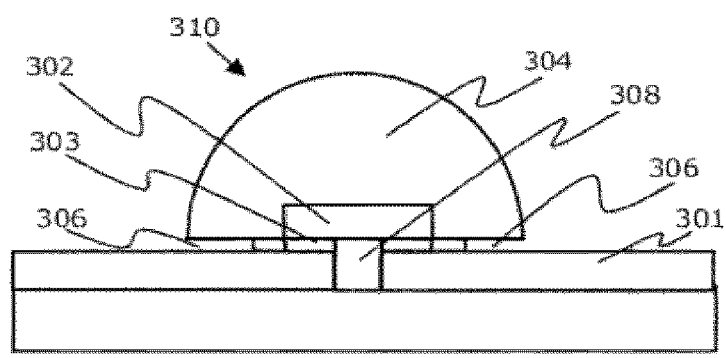
FIG. 3 is a schematic sectional view of another light emitting device according to another embodiment.

When the light emitting element is flip-chip mounted, a translucent substrate made of sapphire or SiC is favorably used. In addition, as shown in FIGS. 2(a), 2(b) and 3, underfills 208 and 308 such as resin may be provided between the substrate and the light emitting element.

(Joint Members 103, 203, 303, and 403)

The light emitting element according to an embodiment is mounted on the substrate or to wiring on the substrate using a joint member.

Known materials can be used as the joint member, and examples of materials that can be used as the joint member include resins such as epoxy resin and silicone resin, resins containing a conductive material such as silver paste and gold paste, solders such as Sn—Ag—Cu based solder, Sn—Cu based solder, Sn—Bi based solder, Sn—Zn based solder, and Au—Sn based solder, and bumps of metals such as Au.

In particular, solders are favorably used. By locally heating and melting solder by laser irradiation or by using a halogen lamp, a hot plate (heater), a hot air blower, a soldering iron, or the like, a light emitting element determined to be defective can be readily detached. In addition, solder is favorable because solder melted by heating can be readily removed from the substrate, and a light emitting element can be mounted to a same portion after detachment.

After mounting the light emitting element with the joint member described above, an electrical connection can be made using a conductive wire between an electrode provided on an upper face of the light emitting element and the wiring. Favorable examples of such wires include thin wires made of a metal such as Au, Ag, Al, and Cu, alloys thereof, and plated alloys.

(Sealing Members 104, 204, 304, and 404)

The sealing member is a member for sealing the light emitting element.

While the sealing member has an approximately hemispherical shaped centered on the light emitting element according to the present embodiment, the sealing member is not limited to this shape.

Known materials can be used as the sealing member and preferable examples include translucent resins (for example, epoxy resin, urea resin, and silicone resin). In particular, since epoxy resin has high adhesion (adhesive strength) and is not easily detached, epoxy resin can enhance the effect of an embodiment.

For purposes of controlling light diffusion and thixotropy or the like, the sealing member may contain a filler such as aluminum oxide, silicon oxide, or titanium oxide.

In addition, the sealing member favorably contains a wavelength converting member such as phosphor which absorbs light from the light emitting element and outputs light with a difference wavelength. Examples of such wavelength converting members include oxide-based phosphors, sulfide-based phosphors, and nitride-based phosphors. When a gallium nitride-based light emitting element that emits blue light is used as the light emitting element, a YAG-based or LAG-based phosphor that absorbs blue light and emits yellow to green light, a SiAlON-based phosphor that absorbs blue light and emits green light, or a SCASN-based or CASN-based phosphor that absorbs blue light and emits red light is favorably used independently or in combination with one other. In particular, a SiAlON-based phosphor and a SCASN-based phosphor are favorably used in combination with each other for a light emitting device used in a display device such as a backlight of a liquid crystal display or a television set. Furthermore, for illumination purposes, a YAG-based or LAG-based phosphor and a SCASN-based or CASN-based phosphor are favorably used in combination with each other.

Since residues of a sealing member containing such a wavelength converting member on the substrate after detachment may cause a variation in the shape of a sealing member when resetting the sealing member or may cause a color variation of a completed light emitting device, the effect of an embodiment of enabling detachment to be readily performed is enhanced.

(Release Layer 105 and Air Layers 206, 306, and 406)

In the light emitting device according to embodiments, a release layer or an air layer is provided between the substrate and the sealing member. Accordingly, the sealing member can be readily detached.

(Position of Release or Air Layer)

While the release layer or the air layer need only be provided in at least a portion between the substrate and the sealing member, the release layer or the air layer is favorably provided on an entire lower face of the sealing member with the exception of a lower part of the light emitting element. Accordingly, the sealing member can be readily detached.

(Shape of Release or Air Layer)

While the release layer or the air layer may have any shape as long as the sealing member can be readily detached, the release layer or the air layer is favorably provided in a planar shape with approximately the same size and approximately the same planar view shape as the lower face (the face opposing the substrate) of the sealing member. Otherwise, the release layer or the air layer can be provided in various planar view shapes such as a dotted shape, a linear shape, a grid-like shape, and a concentric shape or a radial shape that is centered on the light emitting element. While the sealing member does not come into direct contact with the substrate when the release layer or the air layer is provided on an entire lower face of the sealing member, even in this case, the phrase "detaching the sealing member from the substrate" will be used in the present specification.

When providing an air layer, in order to prevent contamination or corrosion due to the light emitting element, the joint member, or the like coming into contact with an outer atmosphere of the sealing member and to produce a highly reliable light emitting device, members such as the light emitting element, the joint member, the wiring, and the like are favorably provided so as to be cut off from the outside of the light emitting device by the sealing member.

For example, as shown in FIG. 3, the light emitting element 302, the joint member 303, and the like can be covered by the sealing member 304 and an air layer 306 may be provided outside of this portion.

Figure 4:
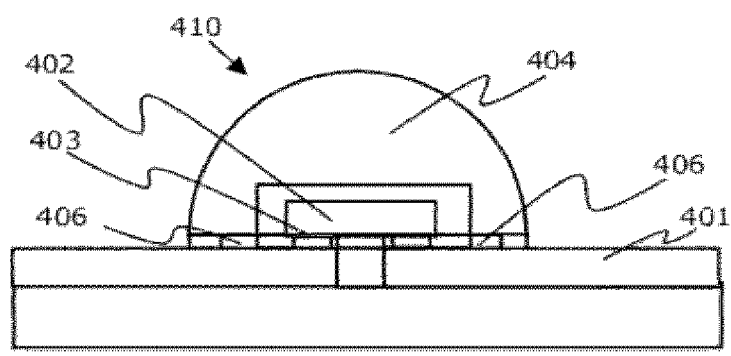
FIG. 4 is a schematic sectional view of another light emitting device according to another embodiment.

In addition, such an air layer may be configured by having apart of the sealing member come into contact with the substrate so as to enclose the light emitting element. For example, as shown in FIG. 4, the air layer 406 can be provided so that a part of the sealing member 404 is in contact with the substrate 401 so as to enclose the light emitting element 402, and the air layer 406 is provided from a contact portion between the part of sealing member 404 and the substrate 401 to an area near the light emitting element 402 or, in other words, the air layer 406 is enclosed by the sealing member 404 and is not continuous with the outside of the light emitting device 410. While a shape of the portion of the sealing member in contact with the substrate is not particularly limited, for example, the portion can have a concentric shape that is centered on the light emitting element.

Furthermore, the sealing member is favorably provided so as to come into contact with the substrate at an outermost peripheral portion and around the light emitting element, and an air layer is favorably provided between the contact portions and the light emitting element. With this arrangement, the sealing member can be fixed in a stable manner.

(Thickness)

While a thickness of the release layer or the air layer is not particularly limited, the thickness is favorably around 15 to 50 µm (micrometers) to enable formation using a simple and inexpensive method such as printing and is more favorably around 15 to 30 µm for the purpose of reducing a decline in light extraction efficiency.

(Material of Release Layer)

As the release layer, materials with lower or higher adhesion with the sealing member as compared to the adhesion between the sealing member and the substrate are used. When the adhesion with the sealing member is low, the sealing member is detached at an interface between the release layer and the sealing member, and when the adhesion with the sealing member is high, the sealing member is detached at an interface between the substrate and the release layer. Examples of specific materials include oil repellent resins or the like that can be suitably selected in consideration of the adhesion between the sealing member and the substrate. Specifically, fluororesins and silicone resins can be used. In particular, fluororesins that facilitate detachment are favorable.

Otherwise, the release layer favorably has translucency or optical reflectance. Specifically, the release layer favorably contains white titanium oxide, silicon oxide, or the like. Accordingly, a higher light extraction rate can be achieved. This is particularly favorable when the substrate has low optical reflectance.

(Method of Forming Release Layer)

The release layer can be formed on the substrate or on the lower face of the sealing member using methods such as printing, coating, spin coating, spraying, and ink jet.

(Air Layer)

Using an air layer is favorable in that a light emitting device enabling a sealing member to be readily detached can be created without providing a new member on the substrate and that resealing can be readily performed since the detached sealing member is less likely to remain on the substrate.

(Method of Forming Air Layer)

The air layer can be formed by methods such as providing another member on the substrate in advance in correspondence to a portion where the air layer is to be provided and removing the member after disposing the sealing member. For example, the air layer can be formed by performing sealing in a state where silicone oil is applied and hardened and subsequently dissolving the silicone oil using a solvent or the like to remove the silicone oil. Alternatively, the air layer can also be formed by a method in which a molded sealing member is bonded onto the light emitting element.

(Combination of Release Layer and Air Layer)

Moreover, the light emitting device according to an embodiment may be configured to include both an air layer and a release layer. With this arrangement, the sealing member can be more readily separated and, at the same time, reliability of the light emitting device can be increased. For example, the release layer can be provided below a portion of the sealing member covering the light emitting element or the joint member, and the air layer can be provided below a portion of the sealing member that is outside of the release layer. Alternatively, for example, the air layer can be provided on the substrate so as to enclose the light emitting element, and a release layer in contact with the sealing member can be provided on the substrate around the air layer.

(Method of Detaching Sealing Member)

Methods of detaching the sealing member are not particularly limited and examples of various means of detaching the sealing member include suctioning and pulling up an upper face of the sealing member, applying a horizontal load to a side face of the sealing member, and bending the substrate when the substrate is flexible.

When the light emitting element is defective, the sealing member and the light emitting element are favorably detached at the same time. Accordingly, the number of steps can be reduced. Therefore, favorably, the sealing member and the light emitting element have high adhesion and, particularly favorably, when using a release layer, the adhesion between the sealing member and the light emitting element is higher than the adhesion between the sealing member and the release layer. Moreover, using a solder as the joint member of the light emitting element is favorable since, by melting the solder, the sealing member and the light emitting element can be readily detached at the same time.

(After Detaching Sealing Member)

After the sealing member is detached, when necessary, a sealing member can be newly disposed (resealed) at a location where the original sealing member had been disposed. In addition, when the light emitting element is detached at the same time as sealing member, a light emitting element can be mounted at or near a location where the detached light emitting element had been mounted and a sealing member can be further provided. Accordingly, the defective sealing member or light emitting element can be readily replaced with a non-defective sealing member or light emitting element, and since a light emitting device can be utilized instead of being discarded, waste and cost can be reduced.

According to the embodiment described above, the sealing member can be readily detached.

EXAMPLES

Hereinafter, examples related to the method of detaching a sealing member of a light emitting device according to an embodiment will be described in detail with reference to the drawings.

First Example

A light emitting device 110 according to the present example includes: a substrate 101 in which, on a brown polyimide film 101*a*, a pair of pieces of copper wirings 101*b* and a white resist 101*c* which is provided so that a part of the wirings is exposed and which is made of silicone resin containing titanium oxide are sequentially provided; a gallium nitride-based light emitting element 102 having a sapphire substrate which is flip-chip mounted on the wirings of the substrate; a Sn—Cu based solder 103 which is a joint member that joins the substrate 101 and the light emitting element 102 to each other; and a sealing member 104 which seals the light emitting element 102 and which is made of a translucent silicone resin containing a YAG phosphor, wherein a 25 m-thick fluororesin layer 105 as a release layer is provided on an entire face between the substrate 101 and the sealing member 104. Adhesion between the fluororesin layer 105 and the sealing member 104 is lower than adhesion between the sealing member 104 and the substrate 101.

In order to detach the sealing member 104 of the light emitting device 110, a near infrared laser is irradiated from a rear face (polyimide film side) of the substrate 101 to heat the solder 103 up to approximately 290 degrees to melt the solder 103. Subsequently, in a melted state of the solder 103, an upper face of the sealing member 104 is suctioned by a suction nozzle 107 to detach the light emitting element 102 and the sealing member 104 from the substrate 101.

According to the present example, the sealing member 104 can be readily detached.

Second Example

A light emitting device 210 according to the present example includes: a substrate 201 in which a pair of pieces of silver wirings which gold plating is performed only on a joint part between the wirings and a light emitting element is provided on an alumina board; a flip-chip mounted light emitting element 202; an Au—Sn based solder 203 which has a composition ratio of approximately 1:9 and which is a joint member that joins the light emitting element 202 onto the wirings of the substrate 201; an underfill 208 provided so as to fill a space between the light emitting element 202 and the substrate 201; and a sealing member 204 which seals the light emitting element 202 and which is made of a translucent epoxy resin, wherein an air layer 206 is provided between the substrate 201 and the sealing member 204.

In order to detach the sealing member 204 of the light emitting device 210, the light emitting device 210 is heated with a hot plate to melt the solder 203. Subsequently, in a melted state of the solder 203, a side face of the sealing member 204 is pushed by a jig 207 in a direction that is horizontal with respect to the substrate 201 to detach the light emitting element 202 and the sealing member 204 from the substrate 201.

According to the present example, the sealing member 204 can be readily detached from the substrate 201 in a similar manner to the first example.

110, 210, 310, 410 light emitting device
101, 201, 301, 401 substrate
102, 202, 302, 402 light emitting element
103, 203, 303, 403 joint member
104, 204, 304, 404 sealing member
105 release layer
206, 306, 406 air layer
107 suction nozzle
207 jig
208, 308 underfill

The invention claimed is:

1. A method of detaching a sealing member of a light emitting device comprising a substrate, a light emitting element mounted on the substrate and a sealing member that seals the light emitting element, the method comprising:
   providing an air layer between the substrate and the sealing member; and
   detaching the sealing member from the substrate at the air layer.

2. The method of detaching a sealing member of a light emitting device according to claim 1, wherein providing the air layer from a contact portion between the part of sealing member and the substrate to an area near the light emitting element.

3. The method of detaching a sealing member of a light emitting device according to claim 1, wherein detaching the sealing member and the light emitting element at the same time.

4. The method of detaching a sealing member of a light emitting device according to claim 1, wherein depositing a new sealing member after detaching the sealing member.

5. The method of detaching a sealing member of a light emitting device according to claim 1, wherein the thickness of the air layer is around 15 to 50 micrometer.

6. The method of detaching a sealing member of a light emitting device according to claim 1, wherein the sealing member contains a wavelength converting member.

7. The method of detaching a sealing member of a light emitting device according to claim 1, wherein the sealing member has hemispherical shape.

8. The method of detaching a sealing member of a light emitting device according to claim 1, further comprising melting a joint member that joins the light emitting element and the substrate, and detaching the light emitting element from the substrate.

9. The method of detaching a sealing member of a light emitting device according to claim 8, wherein the light emitting element is detached from the substrate at the same time that the sealing member is detached from the substrate.

10. The method of detaching a sealing member of a light emitting device according to claim 8, wherein the joint member is a solder.

* * * * *